(12) United States Patent
Chuang et al.

(10) Patent No.: US 9,099,663 B1
(45) Date of Patent: Aug. 4, 2015

(54) QUANTUM DOT SOLAR CELLS WITH BAND ALIGNMENT ENGINEERING

(71) Applicants: Chia-Hao Marcus Chuang, Cambridge, MA (US); Vladimir Bulovic, Lexington, MA (US); Moungi G. Bawendi, Cambridge, MA (US); Patrick Richard Brown, Cambridge, MA (US)

(72) Inventors: Chia-Hao Marcus Chuang, Cambridge, MA (US); Vladimir Bulovic, Lexington, MA (US); Moungi G. Bawendi, Cambridge, MA (US); Patrick Richard Brown, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/268,772

(22) Filed: May 2, 2014

Related U.S. Application Data (60) Provisional application No. 61/982,123, filed on Apr. 21, 2014.

(51) Int. Cl.
| | |
|---|---|
| *H01L 29/06* | (2006.01) |
| *H01L 31/00* | (2006.01) |
| *H01L 51/42* | (2006.01) |
| *H01L 31/0352* | (2006.01) |
| *H01L 31/0272* | (2006.01) |

(52) U.S. Cl.
CPC ........ *H01L 51/4206* (2013.01); *H01L 31/0272* (2013.01); *H01L 31/035209* (2013.01); *H01L 51/428* (2013.01)

(58) Field of Classification Search
CPC .............. H01L 51/4206; H01L 51/428; H01L 31/035209; H01L 31/0272
USPC ..................................................... 257/21, 14
See application file for complete search history.

(56) References Cited

U.S. PATENT DOCUMENTS

| | | | |
|---|---|---|---|
| 8,213,212 B2 | 7/2012 | Sargent et al. | |
| 8,685,781 B2 | 4/2014 | Semonin et al. | |
| 8,729,528 B2 * | 5/2014 | Klem et al. | ..................... 257/21 |
| 2011/0146766 A1 | 6/2011 | Nozik et al. | |

OTHER PUBLICATIONS

Tang J. et al., "Colloidal-quantum-dot photovoltaics using atomic-ligand passivation", Nature Matter. 10, 765-771, (2011).
Luther J. M. et al., "Stability assessment on a 3% bilayer PbS/ZnO quantum dot heterojunction solar cell", Adv. Mater. 22, 3704-3707, (2010).
Semonin O. E. et al., "Peak external photocurrent quantum efficiency exceeding 100% via MEG in a quantum dot solar cell", Science 334,1530-1533, (2011).

* cited by examiner

*Primary Examiner* — Tu-Tu Ho
(74) *Attorney, Agent, or Firm* — Meagher Emanuel Laks Goldberg & Liao, LLP (57) ABSTRACT

A solar cell and method of making are disclosed. The solar cell includes an acceptor layer a donor layer treated with a first quantum dot (QD) ligand and a blocking layer treated with a second, different, QD ligand. The acceptor layer has an acceptor layer valence band and an acceptor layer conduction band. The donor layer has a donor layer valence band and a donor layer conduction band, the donor layer valence band is higher than the acceptor layer valence band, the donor layer conduction band is higher than the acceptor layer conduction band. The blocking layer least partially blocks electron flow in at least one direction, the blocking layer having a blocking layer valence band and a blocking layer conduction band, the blocking layer valence band is higher than the donor layer valence band, the blocking layer conduction band is higher than the donor layer conduction band.

21 Claims, 10 Drawing Sheets

QUANTUM DOT SOLAR CELLS WITH BAND ALIGNMENT ENGINEERING

FIELD OF THE INVENTION

The present disclosure generally relates to solar cells and in more particular to quantum dot solar cells with band alignment engineering.

BACKGROUND

Solution processing is a promising route for the realization of low-cost, large-area, flexible, and light-weight photovoltaic devices with short energy payback time and high specific power. However, solar cells based on solution-processed organic, inorganic, and hybrid materials reported thus far generally suffer from poor air stability, require an inert-atmosphere processing environment, or necessitate high temperature processing, all of which increase manufacturing complexities and costs. Simultaneously fulfilling the goals of high efficiency, low-temperature fabrication conditions, and good atmospheric stability remains a major technical challenge.

SUMMARY OF THE INVENTION

A solar cell and method of making are disclosed. The solar cell includes an acceptor layer a donor layer treated with a first quantum dot (QD) ligand and a blocking layer treated with a second QD ligand that is different than the first QD ligand. An anode is coupled to at least one of the donor layer, acceptor layer and the blocking layer and a cathode coupled to another of the donor layer, acceptor layer and the blocking layer. The acceptor layer has an acceptor layer valence band and an acceptor layer conduction band. The donor layer has a donor layer valence band and a donor layer conduction band, the donor layer valence band is higher than the acceptor layer valence band, the donor layer conduction band is higher than the acceptor layer conduction band. The blocking layer is configured to at least partially block electron flow in at least one direction, the blocking layer having a blocking layer valence band and a blocking layer conduction band, the blocking layer valence band is higher than the donor layer valence band, the blocking layer conduction band is higher than the donor layer conduction band.

The blocking layer may be configured to facilitate hole extraction. The cathode may include at least one of Indium doped tin oxide (ITO) Fluorine-doped tin oxide (FTO) and Aluminum-doped zinc oxide (AZO). The anode may include at least one of Au or Ag. The acceptor layer may include at least one of intrinsic ZnO, doped-ZnO such as ZnMgO, In:ZnO TiO2, doped TiO2 and Cadmium sulfide (CdS). The donor layer may include a PbS QD film treated with TBAI (PbS-TBAI). The blocking layer may include a PbS QD film treated with EDT (PbS-EDT). The donor layer may include at least one of Halide-treated (Cl-, Br-, I-) lead chalcogenide (PbS, PbSe, PbSxSe1-x, PbTe) quantum dots. The blocking layer may include a lead chalcogenide (PbS, PbSe, PbSxSe1-x, PbTe).

A method of forming a solar cell is also disclosed. The method includes forming a donor layer, acceptor layer and blocking layer. The donor layer is treated with a first quantum dot (QD) ligand. The blocking layer is treated with a QD ligand, the first QD ligand being different than the second QD ligand. An anode is coupled to at least one of the donor layer, acceptor layer and the blocking layer. A cathode is coupled to another of the donor layer, acceptor layer and the blocking layer. The acceptor layer has an acceptor layer valence band and an acceptor layer conduction band. The donor layer has a donor layer valence band and a donor layer conduction band, the donor layer valence band being higher than the acceptor layer valence band, the donor layer conduction band being higher than the acceptor layer conduction band. The blocking layer is configured to at least partially block electron flow to the anode. The blocking layer has a blocking layer valence band and a blocking layer conduction band, the blocking layer valence band being higher than the donor layer valence band, the blocking layer conduction band being higher than the donor layer conduction band.

The donor layer acceptor layer and the blocking layer may be formed by solution processing at room temperature. At least one of the donor layer, acceptor layer and the blocking layer may be formed in air. At least one of the donor layer, acceptor layer and the blocking layer may be subjected to thermal treatment after they are formed at room temperature. The blocking layer may be configured to facilitate hole extraction. The cathode may include at least one of Indium doped tin oxide (ITO) Fluorine-doped tin oxide (FTO) and Aluminum-doped zinc oxide (AZO). The anode may include at least one of Au or Ag. The acceptor layer may include at least one of intrinsic ZnO, doped-ZnO such as ZnMgO, In:ZnO TiO2, doped TiO2 and Cadmium sulfide (CdS). The donor layer may include a PbS QD film treated with TBAI (PbS-TBAI). The blocking layer may include a PbS QD film treated with EDT (PbS-EDT). The donor layer may include at least one of Halide-treated (Cl-, Br-, I-) lead chalcogenide (PbS, PbSe, PbSxSe1-x, PbTe) quantum dots. The blocking layer may include a lead chalcogenide (PbS, PbSe, PbSxSe1-x, PbTe).

DETAILED DESCRIPTION

Disclosed herein are quantum dot (QD) solar cells that can be fabricated using solution processing. Such solar cells fulfill the goals of high efficiency, low-temperature fabrication conditions, and good atmospheric stability. For example, QD solar cells may be fabricated using room-temperature solution-processed ZnO/PbS. By engineering the band alignment of the QD layers through the use of different ligand treatments, a certified efficiency of 8.55% has been reached. Furthermore, the performance of unencapsulated devices remains unchanged for over 150 days of storage in air. This material system introduces a new approach towards the goal of high-performance air-stable solar cells compatible with simple solution processes and deposition on flexible substrates.

Near-infrared PbS QDs composed of earth-abundant elements are promising candidates for photovoltaic applications because of a tunable energy bandgap that covers the optimal bandgap range for single and multi-junction solar cells. The QD surface ligands and the photovoltaic device architecture play important roles in determining the optoelectronic properties of QD solar cells. Advances in QD surface passivation, particularly through the use of halide ions as inorganic ligands, have led to rapid improvements in QD solar cell power conversion efficiencies to 7% as a result of a lower density of trapped carriers than in their organic ligands counterparts. In addition, recent studies have demonstrated the ability to control the band edge energies of QD films through ligand exchange. However, fabrication of these recent QD devices requires high-temperature annealing (>500° C.) of the $TiO_2$ window layer or two different processing atmospheres, including an inert gas environment. Although good stability has been claimed, the devices still show performance degradation to ~85% of their original efficiencies within one week even under inert atmosphere.

Disclosed herein are ZnO/PbS solar cells in which the PbS QD and ZnO nanocrystals are both solution-processed in air and at room temperature. These materials can be configured in various forms including nanocrystals and compact films deposited by various methods and environments. The device architecture employs layers of QDs treated with different ligands for different functions by utilizing their relative band alignment. The solar cell generally includes a layer of inorganic-ligand-passivated QDs that serves as the main light-absorbing layer and a layer of organic-ligand-passivated QDs that serves as an electron-blocking/hole-extraction layer. The devices show significant improvements in power conversion efficiency and long-term air-stability, as compared to previously reported devices.

Figure 1A:
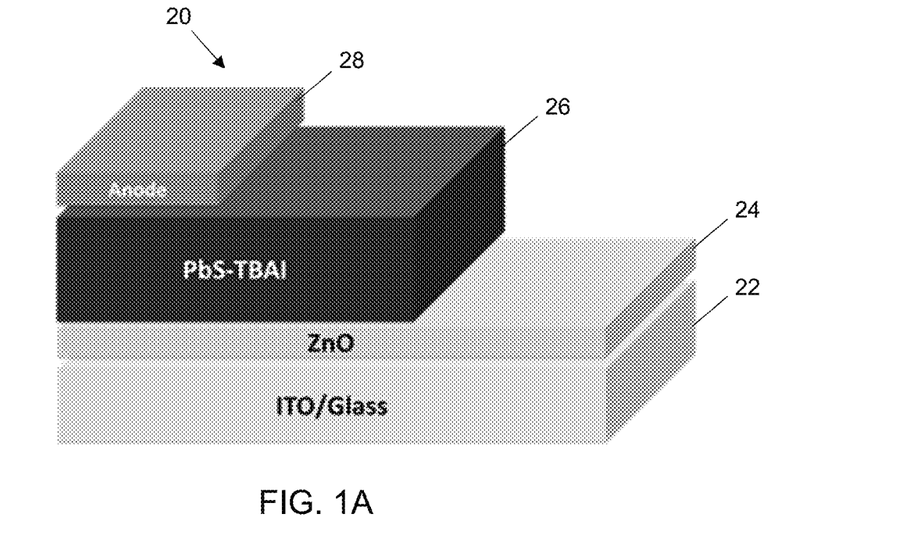
FIG. 1A is a block diagram showing the structure of a basic QD solar cell.

FIG. 1A is a block diagram showing the structure of a basic QD solar cell 20. The solar cell 20 includes a substrate and a cathode shown generally by reference number 22. In this example the substrate is formed of glass and the cathode is formed of ITO. The solar cell 20 also includes an anode 28. It should be understood that a wide range of materials may be used for the substrate, cathode and anode without departing from the scope of this disclosure. For example the cathode may include Indium-doped tin oxide (ITO), Fluorine-doped tin oxide (FTO), Aluminum-doped zinc oxide (AZO) or other transparent conducting materials. The solar cell 20 also includes an acceptor layer 24. In this example the acceptor layer 24 is formed of ZnO. The solar cell 20 also includes a donor layer 26. In this example the donor layer 26 is formed of a PbS QD film treated with TBAI (PbS-TBAI). The term "layer" are used herein encompasses layer structures or films that are formed with one or more physical layers. For example, suitable devices may have layers that are formed in multiple and/or repeated processing steps to obtain a desired thickness. It should be understood that materials other than PbS-TBAI may be used for the donor layer. For example, the donor layer may include Halide-treated (Cl-, Br-, I-) lead chalcogenide (PbS, PbSe, $PbS_xSe_{1-x}$, PbTe) quantum dots. It should also be understood materials other than ZnO may be used for the acceptor including intrinsic ZnO, doped-ZnO such as ZnMgO, In:ZnO, $TiO_2$, doped $TiO_2$ and Cadmium sulfide (CdS).

Figure 1B:
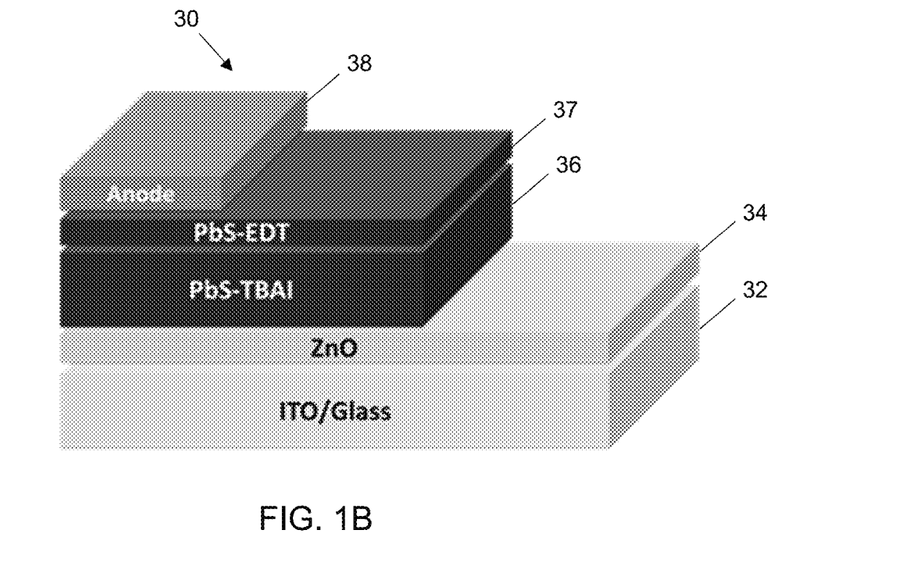
FIG. 1B is a block diagram showing the structure of a QD solar cell including a blocking layer.

FIG. 1B is a block diagram showing the structure of a QD solar cell 30 that is similar to the solar cell 20 shown in FIG. 1A but also includes a blocking layer 37. The solar cell 30 includes a substrate and a cathode shown generally by reference number 32. In this example the substrate is formed of glass and the cathode is formed of ITO. The solar cell 30 also includes an anode 38. As discussed above, a wide range of materials may be used for the substrate, cathode and anode without departing from the scope of this disclosure. The solar cell 30 also includes an acceptor layer 34. In this example the acceptor layer 34 is formed of ZnO. The solar cell 30 also includes a donor layer 36. In this example the donor layer 36 is formed of a PbS QD film treated with TBAI (PbS-TBAI). It should be understood that the same materials may be used for the cathode, donor and acceptor as are discussed above in connection with FIG. 1A. The solar cell 30 also includes a blocking layer 37. The term blocking layer as used herein refers to a layer that at least partially blocks electron flow to the anode while facilitating hole extraction. In this example the blocking layer 37 is formed of a PbS QD film treated with EDT (PbS-EDT). It should be understood that materials other than PbS-EDT may be used for the blocking layer. For example, the blocking layer may include lead chalcogenide (PbS, PbSe, $PbS_xSe_{1-x}$, PbTe).

In general, the blocking layer may include quantum dots treated with a different ligand than the ligand used for the donor layer. For example, organic-ligand passivated lead chalcogenide (PbS, PbSe, $PbS_xSe_{1-x}$, PbTe) quantum dots. The organic ligands can be molecules that contain at least one thiol, carboxylic acid, or amine group. These include the following molecules: ethanethiol, 1,2-Ethanedithiol, benzenethiol, 1,2-benzenedithiol, 1,3-benzenedithiol, 1,4-benzenedithiol, ethylamine, 1,2-ethylenediamine, 3-Mercaptopropionic acid. It may also include Halide-treated (Cl-, Br-, I-) lead chalcogenide (PbS, PbSe, PbSxSe1−x, PbTe) quantum dots (with a different bandgap than the donor layer).

Figure 1C:
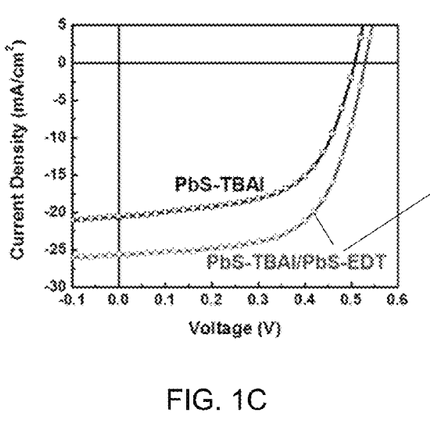
FIG. 1C is a graph showing representative J-V characteristics of devices with Au anodes under simulated AM1.5G irradiation (100 mW/cm$^2$)
Figure 1D:
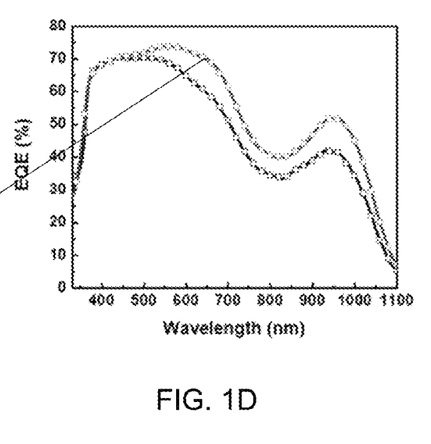
FIG. 1D is a graph showing EQE spectra of devices with Au anodes under simulated AM1.5G irradiation (100 mW/cm$^2$)
Figure 1E:
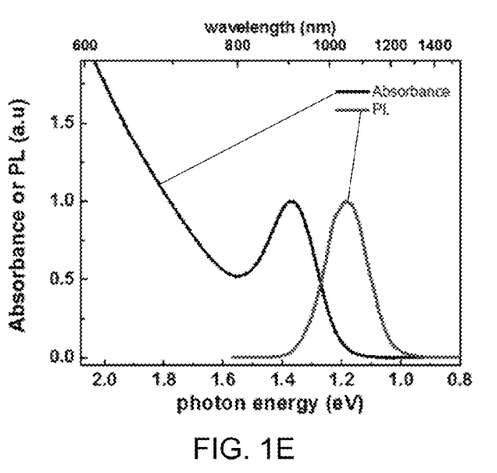
FIG. 1E is a graph showing the absorption and photoluminescence spectra of PbS QDs in octane solution.
Figure 1F:
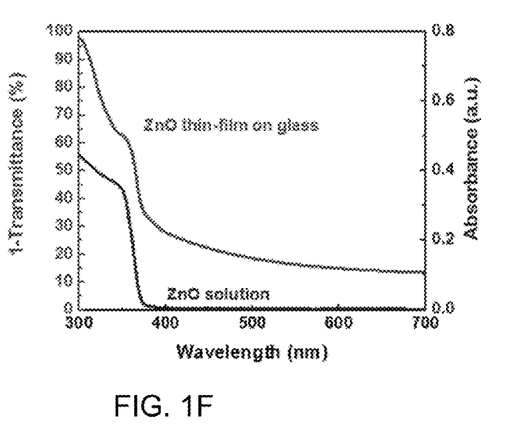
FIG. 1F is a graph showing the absorption spectra of ZnO nanocrystal solution and ZnO thin film on glass substrate.
Figure 1G:
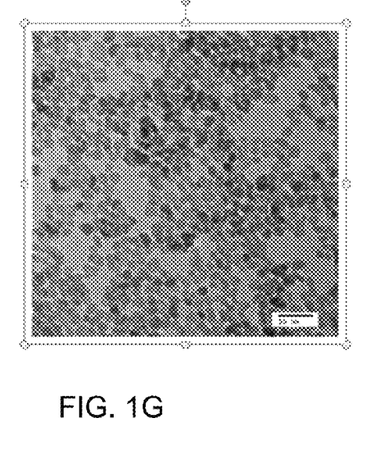
FIG. 1G is a TEM image of ZnO nanocrystals (scale bar: 20 nm)

FIGS. 1E-1G show the characteristics of several materials. FIG. 1E is a graph showing the absorption and photoluminescence spectra of PbS QDs in octane solution. FIG. 1F is a graph showing the absorption spectra of ZnO nanocrystal solution and ZnO thin film on glass substrate. The absorption onset at wavelength λ~370 nm corresponds to a bandgap of ~3.35 eV. The background at longer wavelengths in the thin film absorption spectrum is due to light scattering and reflection. FIG. 1G is a TEM image of ZnO nanocrystals (scale bar: 20 nm).

Figure 1H:
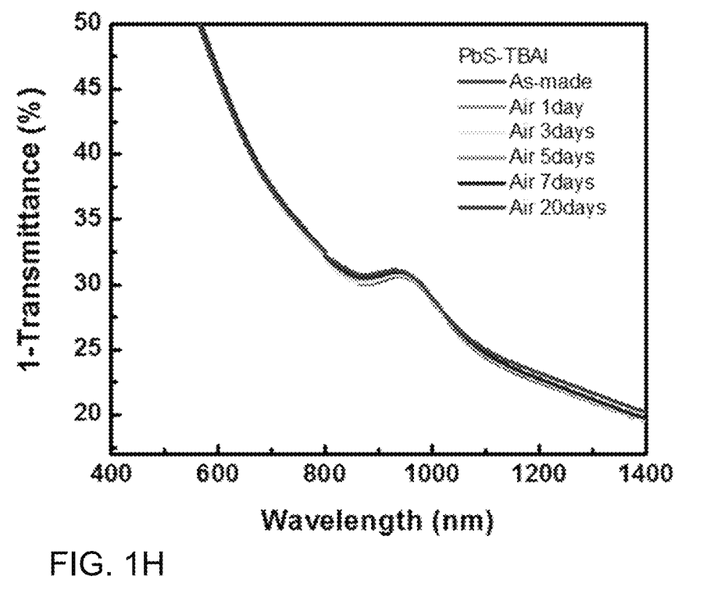
FIG. 1H is a graph showing the evolution of absorption spectra of PbS-TBAI film stored in air over time.
Figure 1I:
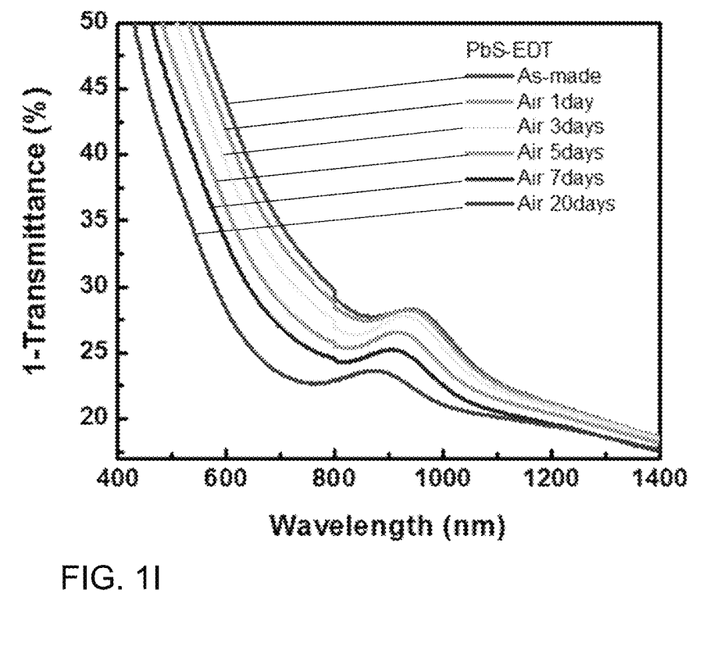
FIG. 1I is a graph showing the evolution of absorption spectra of PbS-EDT film stored in air over time.
Figure 1J:
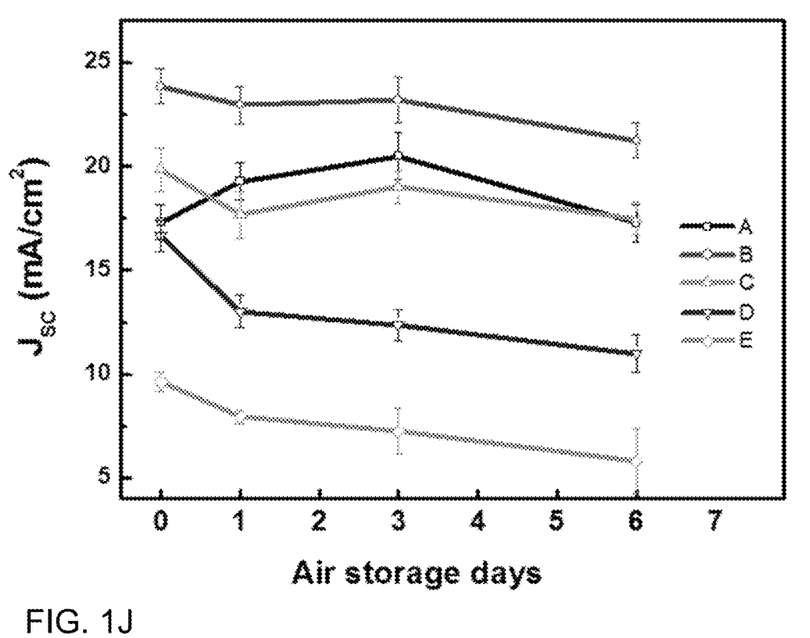
FIG. 1J is a graph showing the change of $J_{SC}$ with air storage over time.
Figure 1K:
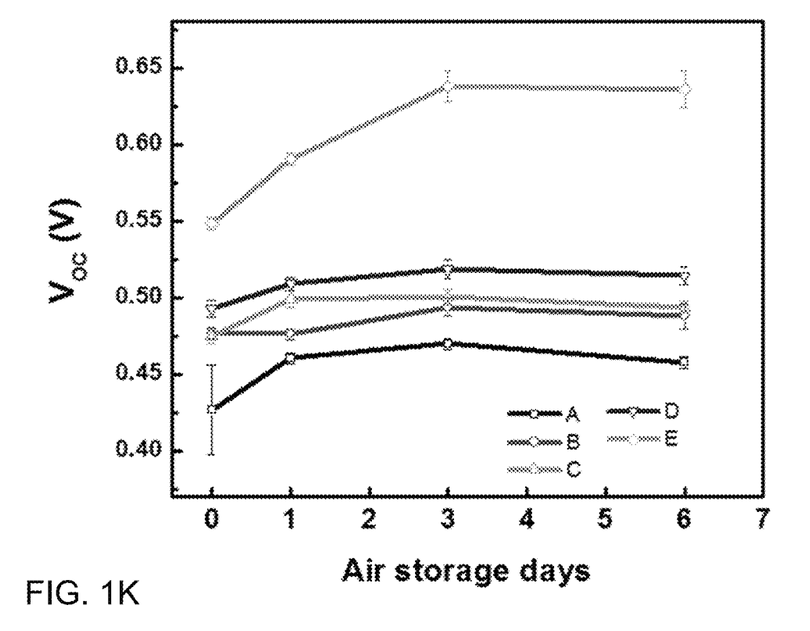
FIG. 1K is a graph showing the change of $V_{OC}$ with air storage over time.

In this example, the structure of Oleic-acid-capped PbS QDs with the first exciton absorption peak at λ=901 nm in solution (FIG. 1E) are used to fabricate the thin films. Tetrabutylammonium iodide (TBAI) and 1,2-ethanedithiol (EDT) are used as the inorganic and organic ligands for solid-state ligand exchange. After solid-state ligand exchange, the first exciton absorption peak shifts to λ~935 nm, which corresponds to an optical bandgap $E_g$=1.33 eV. FIGS. 1H and 1I are graphs showing the evolution of absorption spectra of PbS-TBAI and PbS-EDT films stored in air over time. PbS QD films treated with TBAI (PbS-TBAI) exhibit superior air stability compared to PbS QDs treated with EDT (PbS-EDT) (FIG. 1H and FIG. 1I). FIG. 1H shows no apparent change in the PbS-TBAI film, indicating good stability. The absorption spectra of the PbS-EDT film shows a monotonic decrease in intensity and blue shift with air storage time as a result of oxidation. The discontinuity at wavelength λ=800 nm is an artifact resulting from detector changeover. FIGS. 1J and 1K are graphs showing the change of $J_{SC}$ and $V_{OC}$ with air storage over time. PbS-TBAI-only devices also show a higher short-circuit current density ($J_{SC}$)(FIG. 1J), while PbS-EDT-only devices show a higher open circuit voltage ($V_{OC}$) (FIG. 1K).

FIG. 1D is a graph showing EQE spectra of devices with Au anodes under simulated AM1.5G irradiation (100 mW/cm$^2$). FIG. 1C is a graph showing representative J-V characteristics of devices with Au anodes under simulated AM1.5G irradiation (100 mW/cm$^2$). In this example, the PbS-TBAI device included 12 layers of PbS-TBAI (corresponding to ~220 nm thick film) and the PbS-TBAI/PbS-EDT device included 10 layers of PbS-TBAI and 2 layers of PbS-EDT. The device including 12 PbS-TBAI layers showed a power conversion efficiency of 6.0±0.4%, which is higher than the previously reported TiO$_2$/PbS-TBAI devices consisting of PbS QDs with an additional solution phase CdCl$_2$ treatment and MoO$_3$/Au/Ag anode. Although PbS-EDT-only devices show a lower $J_{SC}$ than PbS-TBAI-only device, replacing the top-most 2 PbS-TBAI layers with 2 PbS-EDT layers significantly improves the $J_{SC}$, $V_{OC}$, and fill factor (FF), resulting in a ~35% improvement in power conversion efficiency to 8.2±0.6% with a 9.2% lab-champion device as shown in Table 1 below.

TABLE 1

| | $V_{OC}$ (V) | $J_{SC}$ (mA/cm$^2$) | FF (%) | PCE (%) |
|---|---|---|---|---|
| PbS-TBAI * | 0.506 ± 0.009 (0.519) | 20.7 ± 1.1 (22.8) | 57.7 ± 1.9 (59.6) | 6.0 ± 0.4 (7.0) |
| PbS-TBAI/PbS-EDT * | 0.525 ± 0.016 (0.544) | 25.3 ± 1.1 (26.5) | 61.6 ± 1.3 (63.8) | 8.2 ± 0.6 (9.2) |
| PbS-TBAI/PbS-EDT certified ** | 0.5546 ± 0.0055 | 24.2 ± 0.7 | 63.8 ± 1.3 | 8.55 ± 0.18 |

In Table 1, the numbers in parentheses represents the values obtained for the best-performing cell. *To account for experimental errors, the reported averages and deviations are for samples of between 6 and 9 devices on the same substrate from measurements performed in between 1 and 75 days of air-exposure. **Error bars: quoted uncertainties with an approximately 95% level of confidence.

Figure 2A:
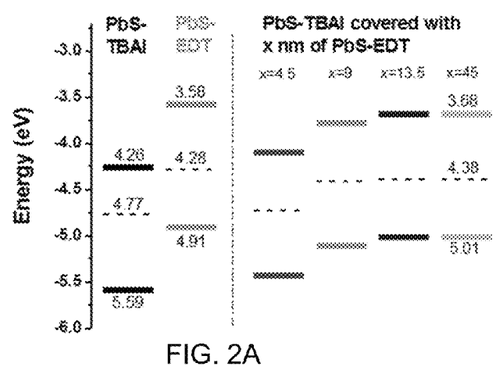
FIG. 2A is an energy level diagram showing the energy levels with respect to vacuum for PbS-TBAI, PbS-EDT, and PbS-TBAI films covered with different thicknesses of PbS-EDT layers.
Figure 2B:
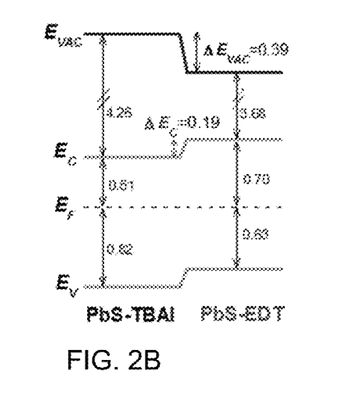
FIG. 2B is a schematic energy level diagram showing the alignment at PbS-TBAI and PbS-EDT interfaces deduced from Ultraviolet photoelectron spectroscopy (UPS)
Figure 2C:
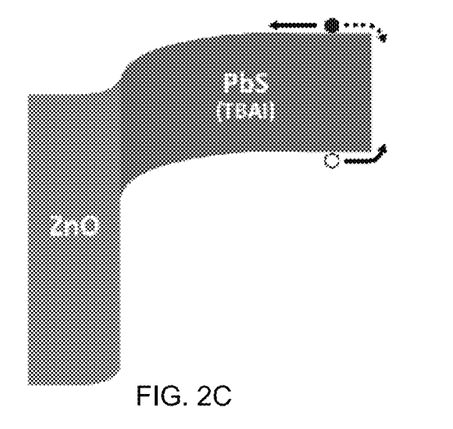
FIG. 2C is a schematic illustration of band bending in a ZnO/PbS-TBAI device at a short-circuit condition.
Figure 2D:
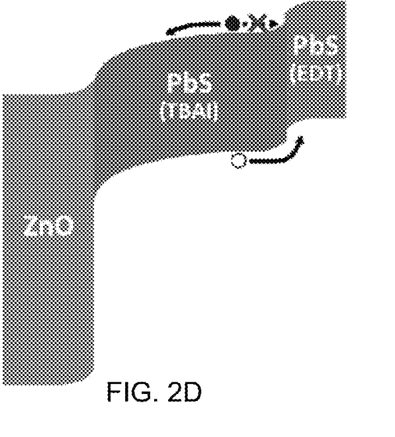
FIG. 2D is a schematic illustration of band bending in a ZnO/PbS-TBAI/PbS-EDT device at a short-circuit condition.

FIGS. 2A-2D are energy level diagrams of PbS QDs and photovoltaic devices containing the QDs. FIG. 2A is an energy level diagram showing the energy levels with respect to vacuum for PbS-TBAI, PbS-EDT, and PbS-TBAI films covered with different thicknesses of PbS-EDT layers. The Fermi levels ($E_F$, dashed line) and valence band edges ($E_V$) were determined by Ultraviolet photoelectron spectroscopy (UPS). The conduction band edges ($E_C$) were calculated by adding the optical bandgap energy of 1.33 eV, as determined from the first exciton absorption peak in the QD thin films, to $E_V$. FIG. 2B is a schematic energy level diagram showing the alignment at PbS-TBAI and PbS-EDT interfaces deduced from UPS. $E_{VAC}$: vacuum level. FIG. 2C is a schematic illustration of band bending in a ZnO/PbS-TBAI device at short-circuit conditions. FIG. 2D is a schematic illustration of band bending in a ZnO/PbS-TBAI/PbS-EDT device at short-circuit conditions. As generally shown in FIGS. 2A-2D, the donor layer, e.g., PbS-TBAI, has a donor layer valence band and a donor layer conduction band. The acceptor layer, e.g., ZnO, also has an acceptor layer valence band and an acceptor layer conduction band. The donor layer valence band is higher than the acceptor layer valence band. The donor layer conduction band is also higher than the acceptor layer conduction band. The blocking layer, e.g., PbS-EDT, has a blocking layer valence band and a blocking layer conduction band. The blocking layer valence band is higher than the donor layer valence band. The blocking layer conduction band is higher than the donor layer conduction band.

Figure 2E:
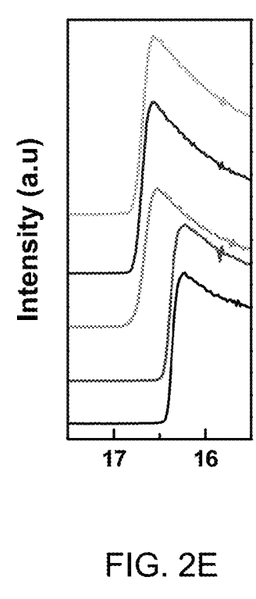
FIGS. 2E-2G are graphs showing the UPS spectra of PbS-TBAI films covered with different thicknesses of PbS-EDT.
Figure 2F:
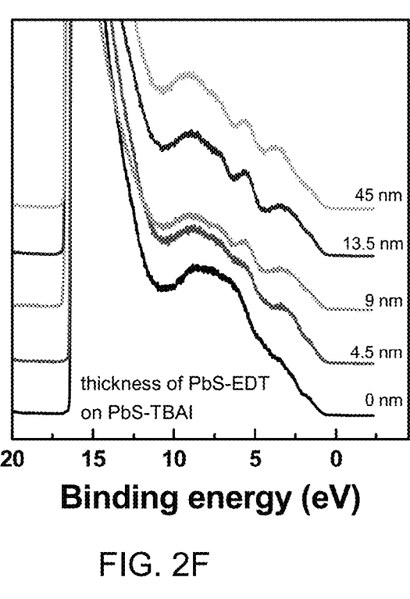
Figure 2G:
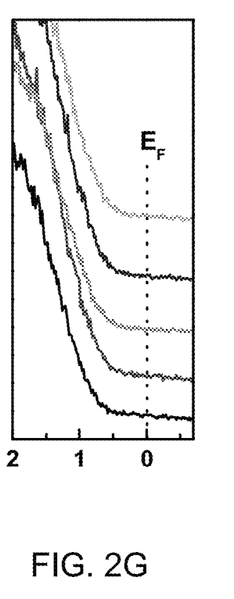

The improvement in efficiency is generally attributed to these band offsets between the two PbS QD layers which effectively block electron flow to the anode while facilitating hole extraction. Ultraviolet photoelectron spectroscopy (UPS, FIGS. 2E-2G) was used to determine the band edge energies with respect to vacuum in PbS QD films (FIG. 2A). FIGS. 2E-2G show the UPS spectra of PbS-TBAI films covered with different thicknesses of PbS-EDT. The left panel shows the secondary electron cut-off region and the right panel shows the magnified spectra near Fermi edge. The spectra were shifted for purposes of clarity. PbS-TBAI exhibits a deeper work function of 4.77 eV (i.e. $E_F$=−4.77 eV with respect to vacuum, where $E_F$ is the Fermi level energy) than PbS-EDT. We attribute the difference in their work functions to the difference between the Pb-halide anion and the Pb-thiol-carbon interactions, which give rise to different surface dipole moments as is discussed elsewhere. In addition, the difference between the Fermi level and valence band edge ($E_V$) in PbS-TBAI is greater ($E_F$−$E_V$=0.82 eV) than that in PbS-EDT ($E_F$−$E_V$=0.63 eV). According to the individually determined band positions, the large conduction band offset (0.68 eV) between PbS-TBAI and PbS-EDT should block electron flow from the PbS-TBAI layer to the PbS-EDT layer. However, since the interactions between the PbS-TBAI and the PbS-EDT layers can affect the interfacial band bending, the actual band offsets in the device must be measured directly.

To determine the band alignment at the PbS-TBAI/PbS-EDT interface, UPS measurements were performed on PbS-TBAI films covered with different thicknesses of PbS-EDT (additional information is provided below). As shown in FIG. 2A, as the thickness of the PbS-EDT layer increases, the Fermi level with respect to vacuum shifts to shallower energy levels and reaches saturation when the thickness of the PbS-EDT layer exceeds 13.5 nm. The shift indicates the formation of an interfacial dipole, which results in a reduction of the work function and a downward vacuum level shift at the interface. Moreover, the difference between the Fermi level and the valence band edge decreases with increasing PbS-EDT layer thickness. The energy level alignment at the PbS-TBAI/PbS-EDT interface deduced from the thickness-dependent UPS data is plotted in FIG. 2B.

The band alignment demonstrates the role of the PbS-EDT layer (blocking layer) as an electron-blocking/hole-extraction layer between the PbS-TBAI layer and the anode, which leads to an improved photocurrent collection efficiency and enhanced device performance in the PbS-TBAI/PbS-EDT devices. In the PbS-TBAI-only device, electron flow from PbS-TBAI to the anode, which is in the opposite direction to the photocurrent, and interfacial recombination at the PbS/anode interface are possible loss mechanisms (FIG. 2C). In the PbS-TBAI/PbS-EDT device, the conduction band offset between the PbS-TBAI and PbS-EDT layers provides an energy barrier that prevents photogenerated electrons from flowing to the PbS-EDT layer, while the valence band offset provides an additional driving force for the flow of photogenerated holes to the PbS-EDT layer. The insertion of the PbS-EDT layer not only prevents electron flow from PbS-TBAI to the anode but may also reduce surface recombination of photogenerated electrons and holes at the PbS-TBAI/anode interface.

The interfacial band bending makes an additional minor contribution to the improved $J_{SC}$. The band bending at the PbS-TBAI/PbS-EDT interface implies the formation of a depletion region adjacent to this junction, which effectively extends the overall depletion width in the PbS-TBAI light-absorbing layer. This effect is similar to that in previously reported graded-doping devices where control of carrier concentrations through ligand exchange extends the depletion region, but there without altering the band edge positions of the PbS QD layers. The extension of the depletion region in those graded-doping devices accounts for a marginal increase (<5%) in $J_{SC}$ compared to ungraded devices.

In the examples studied to date, the PbS-TBAI/PbS-EDT devices typically show ~20% improvements in $J_{SC}$ compared to PbS-TBAI-only devices. As shown in FIG. 1C, the PbS-TBAI/PbS-EDT device exhibits a higher external quantum efficiency (EQE) than that in the PbS-TBAI-only device at longer wavelengths. Long-wavelength photons have longer penetration depths due to the smaller absorption coefficients. Therefore, a higher fraction of long-wavelength photons are absorbed deeper in the film relative to the short-wavelength photons whose absorption is predominantly close to the ZnO/PbS-TBAI interface. The improvement in EQE at longer-wavelengths clearly indicates a better photocurrent collection efficiency especially in the region close to the PbS-TBAI/PbS-EDT interface, consistent with the proposed mechanisms. The $J_{SC}$ calculated by integrating the EQE spectra with AM1.5G solar spectrum for PbS-TBAI-only and PbS-TBAI/PbS-EDT devices are 21.0 and 23.7 mA/cm², respectively, which show good agreement with the measured $J_{SC}$ (20.7±1.1 and 25.3±1.1 mA/cm²).

FIGS. 3A-3D are graphs showing the Evolution of photovoltaic parameters with air storage time in devices with Au and MoO₃/Au anodes. Measurements were performed in a nitrogen-filled glovebox. Day 0 denotes measurements performed after anode evaporation in vacuum. Between each measurement, the unencapsulated devices were stored in air without any humidity control. The average (symbols) and standard deviation (error bars) were calculated based on a sample of between 6 and 9 devices on the same substrate. PCE: power conversion efficiency.

Figure 3A:
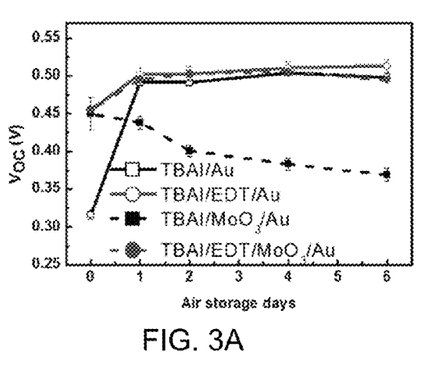
FIG. 3A is a graph showing the Evolution of open circuit voltage (VOC) with air storage time in devices with Au and MoO3/Au anodes.
Figure 3B:
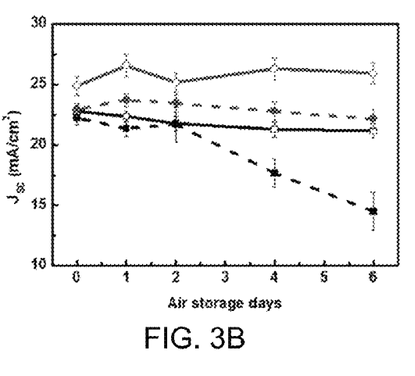
FIG. 3B is a graph showing the Evolution of short-circuit current density (JSC) with air storage time in devices with Au and MoO3/Au anodes.
Figure 3C:
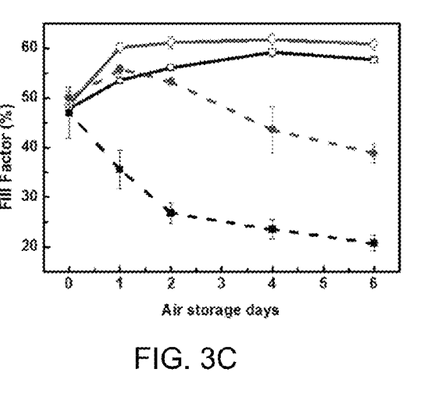
FIG. 3C is a graph showing the Evolution of fill factor with air storage time in devices with Au and MoO3/Au anodes.
Figure 3D:
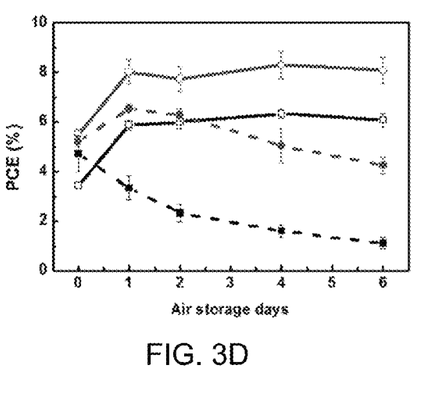
FIG. 3D is a graph showing the Evolution of power conversion efficiency (PCE) with air storage time in devices with Au and MoO3/Au anodes.
Figure 3E:
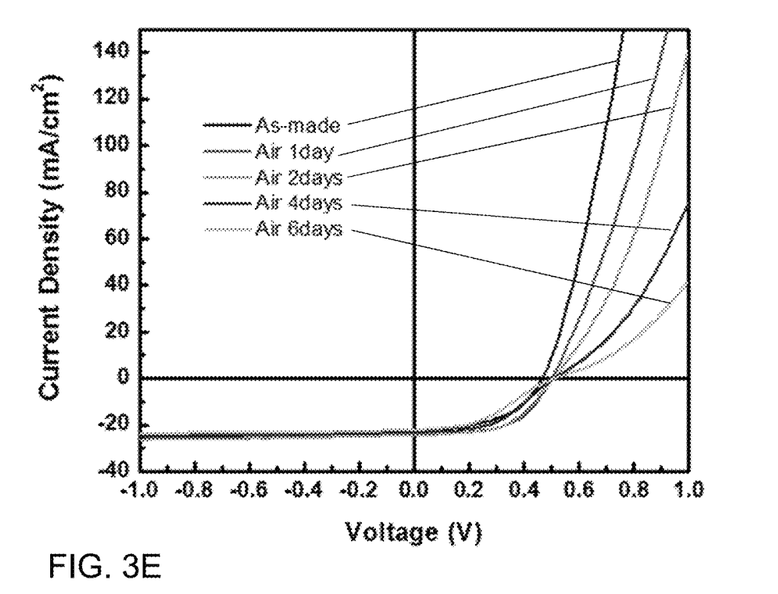
FIG. 3E is graph showing the S-shape J-V characteristics in a PbS-TBAI/PbS-EDT device with MoO3/Au anode after air-exposure.
Figure 3F:
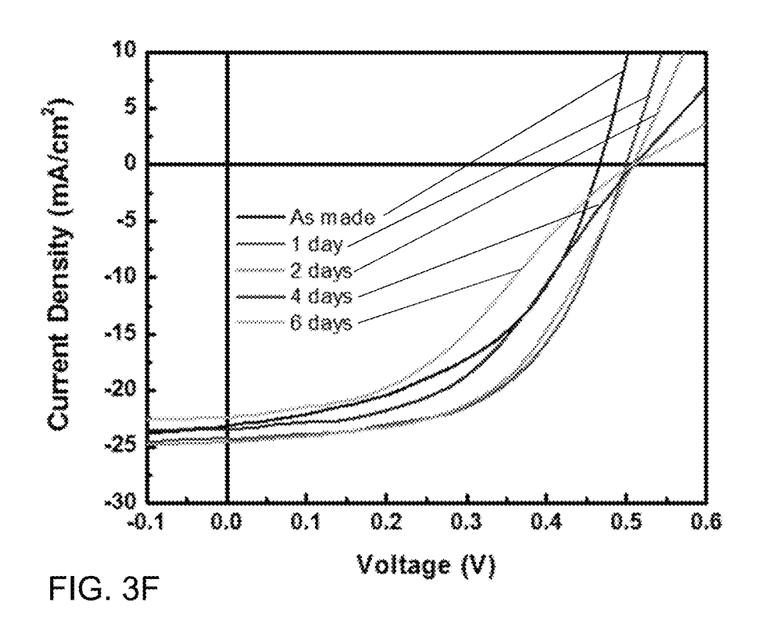
FIG. 3F is graph showing a magnified view of FIG. 3E.

The device stability is found to depend to a greater extent on the interface and band alignment between the QDs and anodes than on the bulk QD layer itself. FIGS. 3A-3D compare the evolution of solar cell performance parameters with air storage time in devices with Au and MoO₃/Au anodes, where the MoO₃ is the commonly used hole-extraction layer in PbS-based and other organic photovoltaic devices. Both PbS-TBAI and PbS-TBAI/PbS-EDT devices with Au anodes show stable performance compared to their counterparts with MoO₃/Au anodes. FIG. 3E is graph showing the S-shape J-V characteristics in a PbS-TBAI/PbS-EDT device with MoO3/Au anode after air-exposure. FIG. 3F is graph showing a magnified view of FIG. 3E. In contrast, devices with MoO₃/Au anodes developed S-shape J-V characteristics after air-exposure (FIGS. 3E and 3F), consistent with the development of a Schottky barrier at the anode. This effect significantly reduces the FF and device performance, limiting air stability.

The mechanism through which MoO₃ acts as the hole-extraction layer is the electron transfer from its deep-lying conduction band or from gap states to the active layer. However, the positions of these states strongly depend on the stoichiometry, environment, and deposition conditions. It has been shown that briefly exposing MoO₃ film deposited under vacuum to oxygen can decrease its work function by more than 1 eV to 5.5 eV. Exposing MoO₃ to humid air can decrease its work function even further. The S-shaped J-V characteristics in devices with a MoO₃ anode are most likely due to unfavorable band alignment between PbS and air-exposed MoO₃. It is noted that the air-exposure time in which this effect becomes significant varies from batch to batch of fabricated devices as a result of uncontrolled humidity in ambient storage conditions. In contrast, the performance of devices without a MoO₃ interfacial layer remains unchanged, implying that the PbS-TBAI absorber layers are functionally insensitive to oxygen and moisture during storage.

It is also noted that devices generally show an initial increase in $V_{OC}$ and FF after air-exposure regardless of the active layer (PbS-TBAI, PbS-EDT, or PbS-TBAI/PbS-EDT) and anode materials (MoO₃/Al, MoO₃/Au, or Au). The ZnO/PbS films are fabricated and stored in air overnight before being transferred to a glovebox for anode deposition. The performance increases during the first hour of air-exposure after evaporation of the metal electrodes. Therefore, further oxidation of the PbS QDs is unlikely to explain the performance enhancement. The origin of this initial increase in performance as a result of short air exposure is still under investigation.

Figure 4A:
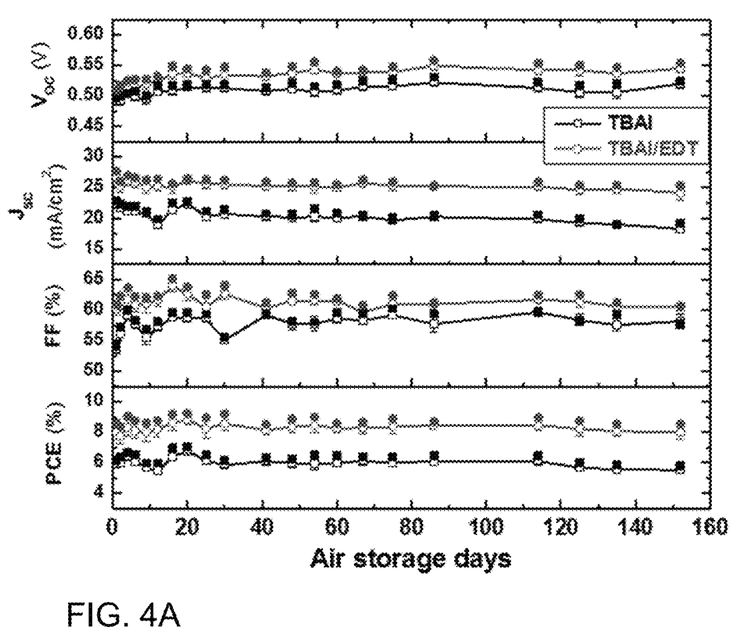
FIG. 4A is a graph showing the evolution of photovoltaic parameters of PbS-TBAI (black) and PbS-TBAI/PbS-EDT (red) devices.
Figure 4B:
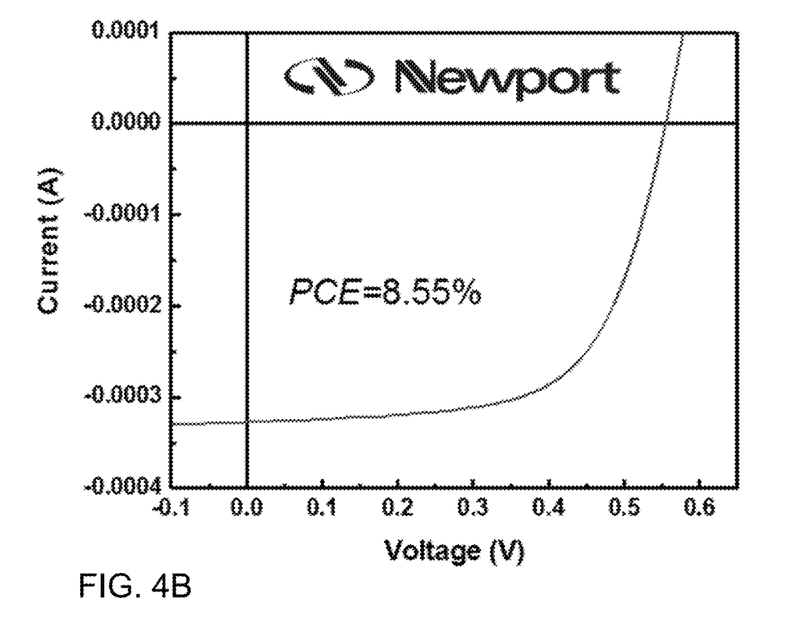
FIG. 4B is a graph showing the device performance of a PbS-TBAI/PbS-EDT device certified by an accredited laboratory after 37 days of air-storage.

FIGS. 4A and 4B show the long-term stability assessment of unencapsulated devices with Au anodes. FIG. 4A is a graph showing the evolution of photovoltaic parameters of PbS-TBAI (black) and PbS-TBAI/PbS-EDT (red) devices. Open symbols represent the average values and solid symbols represent the values for the best-performing device. FIG. 4B is a graph showing the device performance of a PbS-TBAI/PbS-EDT device certified by an accredited laboratory after 37 days of air-storage.

The devices with Au anodes exhibit excellent long-term storage stability in air for over 150 days without any encapsulation (FIG. 4A). During the course of the stability assessment, devices are stored in air in the dark without humidity control but with some exposure to ambient light during sample transfer to the glovebox for testing. Devices have also been tested in air and do not show any degradation in performance after testing in air. An unencapsulated device was sent to an accredited laboratory (Newport Corp.) after 37 days of air-storage. This device tested in air under standard AM1.5G condition shows a power conversion efficiency of 8.55±0.18% (FIG. 4B), which represents the highest certified efficiency to date for colloidal QD photovoltaic devices. This device is believed to have the highest certified efficiency to date for any room-temperature solution-processed solar cell. Another device certified after 131 days of air-storage shows a comparable efficiency of 8.19±0.17% and the highest FF (66.7%) in QD solar cells to date.

Synthesis of Colloidal PbS QDs.

Various aspects of the methods of manufacture of the devices disclosed above are set forth below. The synthesis of oleic-acid-capped PbS QD with a first absorption peak at λ=901 nm may be performed generally as follows. Lead acetate (11.38 g) was dissolved in 21 mL of oleic acid and 300 mL of 1-octadecene at 100° C. The solution was degased overnight and then heated to 150° C. under nitrogen. The sulfur precursor was prepared separately by mixing 3.15 mL of hexamethyldisilathiane and 150 mL of 1-octadecene. The reaction was initiated by rapid injection of the sulfur precursor into the lead precursor solution. After synthesis, the solution was transferred into a nitrogen-filled glovebox. QDs were purified by adding a mixture of methanol and butanol followed by centrifugation. The extracted QDs were re-dispersed in hexane and stored in the glovebox. For device fabrication, PbS QDs were further precipitated twice with a mixture of butanol/ethanol and acetone, respectively, and then re-dispersed in octane (50 mg/ml).

Synthesis of ZnO Nanoparticles.

ZnO nanoparticles may be synthesized as generally set forth below. Zinc acetate dihydrate (2.95 g) was dissolved in 125 mL of methanol at 60° C. Potassium hydroxide (1.48 g) was dissolved in 65 mL of methanol. The potassium hydroxide solution was slowly added to the zinc acetate solution and the solution was kept stirring at 60° C. for 2.5 hours. ZnO nanocrystals were extracted by centrifugation and then washed twice by methanol followed by centrifugation. Finally, 10 ml of chloroform was added to the precipitates and the solution was filtered with a 0.45 μm filter.

Device Fabrication.

Patterned ITO substrates (Thin Film Device Inc.) were cleaned with solvents and then treated with oxygen-plasma. ZnO layers (120 nm) were fabricated by spin-coating a solution of ZnO nanoparticles onto ITO substrates. PbS QD layers were fabricated by layer-by-layer spin-coating. For each layer, ~10 μL of PbS solution was spin-cast onto the substrate at 2500 rpm for 15 s. A TBAI solution (10 mg/ml in methanol) was then applied to the substrate for 30 s followed by three rinse-spin steps with methanol. For PbS-EDT layers, an EDT solution (0.02 vol % in acetonitrile) and acetonitrile were used. All the spin-coating steps were performed under ambient condition and room light at room temperature. The thickness of each PbS-TBAI and PbS-EDT layer is about 18 nm and 23 nm, respectively, as determined by a profilometer (Veeco Dektak 6M). The films were stored in air overnight and then transferred to a nitrogen-filled glovebox for electrode evaporation. $MoO_3$ (Alfa) (25 nm thick), Al or Au electrode (100 nm thick) were thermally evaporated onto the films through shadow masks at a base pressure $10^{-6}$ mbar. The nominal device areas are defined by the overlap of the anode and cathode to be 1.24 $mm^2$. Larger-area devices (5.44 $mm^2$) have also been fabricated and show similar performance. For certification of the larger area device, a 3 $mm^2$ mask was attached to the device to define the device area.

Device Characterization.

Current-voltage characteristics were recorded by using a Keithley 2636A source-meter under simulated solar light illuminations (1-Sun, 100 $mW/cm^2$) generated by a Newport 96000 solar light simulator equipped with an AM1.5G filter. The light intensity was calibrated with a Newport 91150V reference cell before each measurement. The error in efficiency measurements is estimated to be below 7%. EQE measurements were conducted under chopped monochromatic lights from an optical fiber in an underfilled geometry without bias illumination. The light source was provided by coupling the white light from a xeon lamp (Thermo Oriel 66921) through a monochromator into the optical fiber and the photocurrent was recorded by using a lock-in amplifier (Stanford Research System SR830). Both current-voltage and EQE measurements were performed under an inert-atmosphere unless stated otherwise. Devices were stored in ambient air between each measurement.

Ultraviolet Photoelectron Spectroscopy (UPS).

PbS-TBAI and PbS-EDT samples for UPS measurements were fabricated in air by six layer-by-layer spin-coating steps to obtain ~110 nm thick PbS films on glass/Cr(10 nm)/Au(80 nm) substrates. For PbS-EDT-thickness dependent UPS, a diluted PbS solution (10 mg/mL) was used to obtain the thinner PbS-EDT layers on PbS-TBAI films. The samples were then stored in air overnight before UPS measurements. Ultraviolet photoelectron spectroscopy measurements were performed in an ultra high vacuum chamber ($10^{-10}$ mbar) with a He(I) (21.2 eV) discharge lamp. Carbon tape was used to make electrical contact between the Cr/Au anode and the sample plate. A −5.0V bias was applied to the sample to accurately determine the low-kinetic energy photoelectron cut-off. Photoelectrons were collected at 0° from normal and the spectra were recorded using an electron spectrometer (Omnicron). The conduction band edge energies were calculated by adding the optical bandgap energy of 1.33 eV determined by the first exciton absorption peak in the QD thin films to the valence band edge energies. The $E_F$–$E_V$ values have an error bar of ±0.02 eV resulting from curve fitting.

In summary, high-performance quantum dot solar cell through the engineering of band alignment at QD/QD and QD/anode interfaces have been demonstrated. These solar cells are processed at room temperature and in air. Furthermore, they exhibit excellent air-storage stability. The disclosed results indicate that the by utilizing the relative band alignment between the PbS layers treated with two different ligands, the device performance can be significantly improved. The disclosed results also indicates that (i) using inorganic-ligand-passivated QDs as the light-absorbing layer and (ii) removal of the $MoO_3$ interfacial layer are essential to achieving air-stability.

While several embodiments have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present embodiments. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings herein is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, the embodiments disclosed may be practiced otherwise than as specifically described and claimed. The present embodiments are directed to each individual feature, system, article, material and/or method described herein. In addition, any combination of two or more such features, systems, articles, materials and/or methods, if such features, systems, articles, materials and/or methods are not mutually inconsistent, is included within the scope of the present embodiments.

What is claimed is:

1. A solar cell comprising:
an acceptor layer, a donor layer treated with a first quantum dot (QD) ligand and a blocking layer treated with a second QD ligand that is different than the first QD ligand; and
an anode coupled to at least one of the donor layer, acceptor layer and the blocking layer and a cathode coupled to another of the donor layer, acceptor layer and the blocking layer;
the acceptor layer having an acceptor layer valence band and an acceptor layer conduction band;
the donor layer having a donor layer valence band and a donor layer conduction band, the donor layer valence band being higher than the acceptor layer valence band, the donor layer conduction band being higher than the acceptor layer conduction band;
the blocking layer being configured to at least partially block electron flow in at least one direction, the blocking layer having a blocking layer valence band and a blocking layer conduction band, the blocking layer valence band being higher than the donor layer valence band, the blocking layer conduction band being higher than the donor layer conduction band.

2. The solar cell of claim 1 wherein the blocking layer is configured to facilitate hole extraction.

3. The solar cell of claim 1 wherein the cathode comprises at least one of Indium doped tin oxide (ITO), Fluorine-doped tin oxide (FTO) and Aluminum-doped zinc oxide (AZO).

4. The solar cell of claim 1 wherein the anode comprises at least one of Au or Ag.

5. The solar cell of claim 1 wherein the acceptor layer includes at least one of intrinsic ZnO, doped-ZnO such as ZnMgO, In:ZnO TiO2, doped TiO2 and Cadmium sulfide (CdS).

6. The solar cell of claim 1 wherein the donor layer is comprised of a PbS QD film treated with TBAI (PbS-TBAI).

7. The solar cell of claim 1 wherein the blocking layer is comprised of a PbS QD film treated with EDT (PbS-EDT).

8. The solar cell of claim 1 wherein the donor layer includes at least one of Halide-treated (Cl-, Br-, I-) lead chalcogenide (PbS, PbSe, PbSxSe1-x, PbTe) quantum dots.

9. The solar cell of claim 1 wherein the blocking layer include a lead chalcogenide (PbS, PbSe, PbSxSe1-x, PbTe).

10. A method of forming a solar cell, the method comprising:
forming an acceptor layer;
forming a donor layer treated with a first quantum dot (QD) ligand;
forming a blocking layer treated with a second QD ligand, the first QD ligand being different than the second QD ligand; and
coupling an anode to at least one of the donor layer, acceptor layer and the blocking layer and coupling a cathode to another of the donor layer, acceptor layer and the blocking layer;
the acceptor layer having an acceptor layer valence band and an acceptor layer conduction band;
the donor layer having a donor layer valence band and a donor layer conduction band, the donor layer valence band being higher than the acceptor layer valence band, the donor layer conduction band being higher than the acceptor layer conduction band;
the blocking layer being configured to at least partially block electron flow to the anode, the blocking layer having a blocking layer valence band and a blocking layer conduction band, the blocking layer valence band being higher than the donor layer valence band, the blocking layer conduction band being higher than the donor layer conduction band.

11. The method of claim 10, wherein at least one of the donor layer, acceptor layer and the blocking layer are formed by solution processing at room temperature.

12. The method of claim 10 wherein at least one of the donor layer, acceptor layer and the blocking layer are formed in air.

13. The method of claim 10 wherein at least one of the donor layer, acceptor layer and the blocking layer are subjected to thermal treatment after they are formed at room temperature.

14. The method of claim 10 wherein the blocking layer is configured to facilitate hole extraction.

15. The method of claim 10 wherein the cathode comprises at least one of Indium doped tin oxide (ITO), Fluorine-doped tin oxide (FTO) and Aluminum-doped zinc oxide (AZO).

16. The method of claim 10 wherein the anode comprises at least one of Au or Ag.

17. The method of claim 10 wherein the acceptor layer includes at least one of intrinsic ZnO, doped-ZnO such as ZnMgO, In:ZnO TiO2, doped TiO2 and Cadmium sulfide (CdS).

18. The method of claim 10 wherein the donor layer is comprised of a PbS QD film treated with TBAI (PbS-TBAI).

19. The method of claim 10 wherein the blocking layer is comprised of a PbS QD film treated with EDT (PbS-EDT).

20. The method of claim 10 wherein the donor layer includes at least one of Halide-treated (Cl-, Br-, I-) lead chalcogenide (PbS, PbSe, PbSxSe1-x, PbTe) quantum dots.

21. The method of claim 10 wherein the blocking layer includes a lead chalcogenide (PbS, PbSe, PbSxSe1-x, PbTe).

* * * * *